(12) United States Patent
Iijima (10) Patent No.: US 11,493,574 B2
(45) Date of Patent: Nov. 8, 2022

(54) MAGNETIC MATERIAL INSPECTION DEVICE

(71) Applicant: Shimadzu Corporation, Kyoto (JP)

(72) Inventor: Kenji Iijima, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 151 days.

(21) Appl. No.: 16/995,308

(22) Filed: Aug. 17, 2020

(65) Prior Publication Data
US 2022/0050152 A1    Feb. 17, 2022

(51) Int. Cl.
*G01R 33/12*    (2006.01)
*G01N 27/02*    (2006.01)

(52) U.S. Cl.
CPC ....... *G01R 33/1223* (2013.01); *G01N 27/023* (2013.01)

(58) Field of Classification Search
CPC .......................... G01R 33/1223; G01N 27/023
USPC .......................................................... 324/239
See application file for complete search history.

(56) References Cited

U.S. PATENT DOCUMENTS

| | | | | |
|---|---|---|---|---|
| 5,432,444 A * | 7/1995 | Yasohama | ............... | G01N 27/82 324/228 |
| 6,268,723 B1 * | 7/2001 | Hash | ....................... | G06K 7/083 340/572.1 |
| 6,437,563 B1 * | 8/2002 | Simmonds | ........... | G01N 27/745 436/526 |
| 6,483,303 B2 * | 11/2002 | Simmonds | ............. | G01R 33/12 436/526 |
| 6,642,711 B2 * | 11/2003 | Kawate | ................ | G01D 5/2225 341/15 |
| 6,867,586 B2 * | 3/2005 | Hatcher | ............... | G01N 27/902 324/262 |
| 6,927,570 B2 * | 8/2005 | Simmonds | ............. | G01R 33/12 436/526 |
| 7,068,029 B2 * | 6/2006 | Hatcher | ............... | G01N 27/902 324/262 |

(Continued)

FOREIGN PATENT DOCUMENTS

| | | | | |
|---|---|---|---|---|
| CN | 102870012 A | * | 1/2013 | ........... G01N 27/023 |
| CN | 112119301 A | * | 12/2020 | ............. G01N 27/82 |

(Continued)

OTHER PUBLICATIONS

Catalog, "Wire Rope Tester MF550", Tokyo Rope Mfg. Co., Ltd., pp. 1 to 3. Date of download: on or before Oct. 27, 2017. It is presently understood that this or a similar web document may have been created on Mar. 1, 2010 and updated on Oct. 5, 2010.

(Continued)

*Primary Examiner* — Jermele M Hollington
*Assistant Examiner* — Sean Curtis
(74) *Attorney, Agent, or Firm* — Muir Patent Law, PLLC (57) ABSTRACT

The magnetic material inspection device includes: a differential coil configured to detect a change in a magnetic field of a magnetic material and transmit a differential signal, the differential coil including a pair of receiving coils; a detection coil configured to detect the change in the magnetic field of the magnetic material and transmit a detection signal; and a controller configured to detect a state of the magnetic material based on the differential signal of the differential coil and detect the state of the magnetic material based on the detection signal of the detection coil.

10 Claims, 4 Drawing Sheets

(56) References Cited

U.S. PATENT DOCUMENTS

| | | | | |
|---|---|---|---|---|
| 8,129,987 | B2* | 3/2012 | Bosnar | G01R 33/10 |
| | | | | 324/228 |
| 8,155,726 | B2* | 4/2012 | Seki | G01R 33/04 |
| | | | | 600/407 |
| 8,269,488 | B2* | 9/2012 | Hyodo | G01N 27/9053 |
| | | | | 324/239 |
| 8,294,459 | B2* | 10/2012 | Bosnar | G01R 33/10 |
| | | | | 324/228 |
| 8,610,426 | B2* | 12/2013 | Hyodo | G01N 27/82 |
| | | | | 324/239 |
| 11,092,570 | B2* | 8/2021 | Iijima | G01N 27/83 |
| 11,358,836 | B2* | 6/2022 | Iijima | G01N 27/87 |
| 11,391,697 | B2* | 7/2022 | Iijima | G01N 27/82 |
| 2002/0097042 | A1* | 7/2002 | Kawate | G01D 5/2225 |
| | | | | 324/207.17 |
| 2004/0051525 | A1* | 3/2004 | Hatcher | G01N 27/902 |
| | | | | 324/262 |
| 2004/0150396 | A1* | 8/2004 | Simmonds | G01N 27/745 |
| | | | | 324/244 |
| 2005/0200355 | A1* | 9/2005 | Hatcher | G01N 27/902 |
| | | | | 324/239 |
| 2008/0315870 | A1* | 12/2008 | May | G01D 5/2046 |
| | | | | 324/239 |
| 2009/0143665 | A1* | 6/2009 | Seki | G01R 33/0354 |
| | | | | 600/409 |
| 2010/0134099 | A1* | 6/2010 | Hyodo | G01N 27/9053 |
| | | | | 324/239 |
| 2011/0037460 | A1* | 2/2011 | Bosnar | G01R 33/10 |
| | | | | 324/239 |
| 2011/0037462 | A1* | 2/2011 | Bosnar | G01R 33/10 |
| | | | | 324/243 |
| 2012/0032672 | A1* | 2/2012 | Hyodo | G01N 27/82 |
| | | | | 324/239 |
| 2012/0306483 | A1* | 12/2012 | Boenisch | G01N 27/82 |
| | | | | 324/239 |
| 2013/0234701 | A2* | 9/2013 | Boenisch | G01N 27/9006 |
| | | | | 324/239 |
| 2015/0233868 | A1* | 8/2015 | Zec | G01N 27/9026 |
| | | | | 324/240 |
| 2017/0023347 | A1* | 1/2017 | Ouellette | G01N 27/82 |
| 2017/0038338 | A1* | 2/2017 | Kondoh | G01N 27/83 |
| 2019/0079053 | A1* | 3/2019 | Hirota | G01N 27/83 |
| 2019/0360965 | A1* | 11/2019 | Iijima | G01N 27/83 |
| 2021/0107770 | A1* | 4/2021 | Iijima | B66B 7/123 |
| 2021/0215639 | A1* | 7/2021 | Iijima | G01N 27/82 |
| 2021/0373091 | A1* | 12/2021 | Hiligsmann | G01R 33/0047 |
| 2021/0380372 | A1* | 12/2021 | Iijima | G01N 27/82 |
| 2021/0382008 | A1* | 12/2021 | Kodama | G01N 27/82 |
| 2022/0003712 | A1* | 1/2022 | Iijima | G01N 27/82 |
| 2022/0050152 | A1* | 2/2022 | Iijima | G01N 27/023 |
| 2022/0212894 | A1* | 7/2022 | Ito | B66B 7/123 |

FOREIGN PATENT DOCUMENTS

| | | | | |
|---|---|---|---|---|
| CN | 113740413 | A | * 12/2021 | |
| EP | 2502062 | B1 | * 7/2013 | G01N 27/9033 |
| EP | 2502061 | B1 | * 3/2019 | G01B 7/10 |
| EP | 3514559 | A1 | * 7/2019 | G01D 5/204 |
| EP | 3764094 | A1 | * 1/2021 | B66B 5/12 |
| EP | 3879263 | A1 | * 9/2021 | G01N 27/82 |
| JP | H06-294776 | A | 10/1994 | |
| JP | H07198817 | A | * 8/1995 | G01R 33/1223 |
| JP | 2012-093249 | A | 5/2012 | |
| JP | 2019138703 | A | * 8/2019 | H01L 22/32 |
| JP | 2019168253 | A | * 10/2019 | |
| JP | 2019200157 | A | * 11/2019 | |
| JP | 2019203782 | A | * 11/2019 | |
| JP | 2020008500 | A | * 1/2020 | |
| JP | 2020076591 | A | * 5/2020 | |
| JP | 2020118620 | A | * 8/2020 | |
| JP | 2021169354 | A | * 10/2021 | |
| JP | 2021173605 | A | * 11/2021 | |
| JP | 2021185351 | A | * 12/2021 | |
| JP | 7027927 | B2 | * 3/2022 | H01L 22/32 |
| JP | 2022046312 | A | * 3/2022 | |
| KR | 20200088439 | A | * 7/2020 | |
| RU | 2627951 | C2 | * 8/2017 | D07B 1/005 |
| WO | WO-2011058369 | A1 | * 5/2011 | G01N 27/9033 |
| WO | WO-2011058370 | A1 | * 5/2011 | G01B 7/10 |
| WO | WO-2019141861 | A1 | * 7/2019 | G01D 5/204 |
| WO | WO-2019150539 | A1 | * 8/2019 | B66B 7/123 |
| WO | WO-2019171667 | A1 | * 9/2019 | B66B 5/12 |
| WO | WO-2019220953 | A1 | * 11/2019 | G01N 27/82 |
| WO | WO-2020095354 | A1 | * 5/2020 | G01N 27/82 |
| WO | WO-2020246130 | A1 | * 12/2020 | B66B 7/123 |
| WO | WO-2020246131 | A1 | * 12/2020 | |
| WO | WO-2021152939 | A1 | * 8/2021 | |
| WO | WO-2021186768 | A1 | * 9/2021 | |
| WO | WO-2022054315 | A1 | * 3/2022 | |

OTHER PUBLICATIONS

"Health Diagnostics of Wire Rope and Steel Structure", Tokyo Rope Mfg. Co., Ltd., submitted with a machine translation, pp. 4 to 7. Date of download: on or before Oct. 27, 2017. It is presently understood that this or a similar web document may have been created on Jul. 14, 2006 and updated on Oct. 28, 2014.

Notice of Reasons for Refusal dated Jun. 22, 2021 for corresponding Japanese Patent Application No. 2018-020326, submitted with a machine translation.

* cited by examiner

MAGNETIC MATERIAL INSPECTION DEVICE

CROSS-REFERENCE TO RELATED APPLICATIONS

The related application number JP2018-020326, entitled "MAGNETIC MATERIAL INSPECTION DEVICE", filed on Feb. 7, 2018 and invented by Kenji Iijima, upon which this patent application is based is hereby incorporated by reference.

BACKGROUND OF THE INVENTION

Field of the Invention

The present invention relates to a magnetic material inspection device, and more particularly, to a magnetic material inspection device equipped with a differential coil.

Description of the Background Art

A magnetic material inspection device equipped with a differential coil is known. Such a magnetic material inspection device is disclosed in, for example, Japanese Unexamined Patent Application Publication No. 2012-093249.

The above-described Japanese Unexamined Patent Application Publication No. 2012-093249 discloses a magnetic permeability sensor (magnetic material inspection device) equipped with a differential coil configured to detect a change in a magnetic field of a magnetic material and transmit a differential signal. The differential coil includes a pair of receiving coils. In Japanese Unexamined Patent Application Publication No. 2012-093249, it is configured to detect a structural change of a magnetic material based on a differential signal.

In the permeability sensor (magnetic material inspection device) described in Japanese Unexamined Patent Application Publication No. 2012-093249, a structural change of a magnetic material is detected based on a differential signal of a differential coil. Therefore, in the case of an abrupt structural change (e.g., breakage) of the magnetic material in the range of about the distance between the pair of receiving coils of the differential coil, the magnetic permeability sensor disclosed by Japanese Unexamined Patent Application Publication No. 2012-093249 can detect the abrupt structural change. This is because the differential signal can reduce the noise due to the influence of the magnetic field around the magnetic object to be inspected.

However, in the permeability sensor disclosed by Japanese Unexamined Patent Application Publication No. 2012-093249, in the case of a gradual structural change (e.g., a gradual change in the cross-sectional area) of the magnetic material in a very large range as compared with the distance between the pair of receiving coils of the differential coil, such a gradual structural change is less likely to appear as a differential signal of the differential coil. Therefore, there is a disadvantage that it is difficult to detect. For the reasons described above, there is a problem that it is difficult to detect both an abrupt structural change of a magnetic material and a gradual structural change of a magnetic material.

SUMMARY OF THE INVENTION

The present invention has been made to solve the above-mentioned problems. An object of the present invention is to provide a magnetic material inspection device capable of easily detecting both an abrupt structural change of a magnetic material and a gradual structural change of a magnetic material.

In order to achieve the above-described object, the magnetic material inspection device according to one aspect of the present invention, includes: a differential coil configured to detect a change in a magnetic field of a magnetic material and transmit a differential signal, the differential coil including a pair of receiving coils; a detection coil configured to detect the change in the magnetic field of the magnetic material and transmit a detection signal; and a controller configured to detect a state of the magnetic material based on the differential signal of the differential coil and detect the state of the magnetic material based on the detection signal of the detection coil.

In the magnetic material inspection device according to one aspect of the present invention, with the above-described configuration, it is possible to reduce the noise due to the influence of the magnetic field around the magnetic material by the differential signal of the differential coil. Therefore, it is possible to easily detect an abrupt structural change of the magnetic material in the range of about the distance between the pair of receiving coils of the differential coil. Further, it is possible to detect the absolute value of the magnetic flux passing through the magnetic material by the detection signal of the detection coil. Therefore, although the noise remains somewhat, it is possible to easily detect a gradual structural change of the magnetic material in a very large range as compared with the distance between the pair of receiving coils of the differential coil. As a result, it is possible to easily detect both the abrupt structural change in the magnetic material and the gradual structural change in the magnetic material.

In the above-described magnetic material inspection device according to the one aspect of the present invention, the controller is preferably configured to detect an abrupt structural change of the magnetic material based on the differential signal of the differential coil and detect a gradual structural change of the magnetic material based on the detection signal of the detection coil. With this configuration, based on the differential signal and the detection signal, the controller can easily detect, for example, an abrupt structural change of the magnetic material, such as breakage, and a gradual structural change of the magnetic material, such as a gradually cross-sectional area change.

In the above-described magnetic material inspection device according to the one aspect of the present invention, the controller is preferably configured to comprehensively determine damage of the magnetic material based on both the differential signal of the differential coil and the detection signal of the detection coil. With this configuration, it is possible to detect the local damage to the magnetic material, such as, e.g., breakage, cross-sectional area change, rust, and abrasion of the magnetic material, based on the differential signal. Further, it is possible to detect the wide range damage to the magnetic material, such as, e.g., breakage, cross-sectional area change, rust, and abrasion of the magnetic material, based on the detection signal.

In the above-described magnetic material inspection device according to the one aspect of the present invention, the magnetic material inspection device preferably further includes: a first transmission line for transmitting the differential signal of the differential coil; and a second transmission line for transmitting the detection signal of the detection coil. With this configuration, the differential signal and the detection signal are transmitted via the first transmission line and the second transmission line, respectively. Therefore, it is possible to detect both the abrupt structural change and the gradual structural change of the magnetic material in parallel. As a result, it is possible to shorten the time required to inspect the magnetic material.

In the above-described magnetic material inspection device according to the one aspect of the present invention, the detection coil is preferably configured by one of the pair of the receiving coils of the differential coil. With this configuration, as compared with the case of providing the detection coil separately from the differential coil, the increase in the number of parts can be suppressed, and the device configuration can be simplified.

In the above-described magnetic material inspection device according to the one aspect of the present invention, the detection coil is preferably configured by an excitation coil for exciting a state of magnetization of the magnetic material. With this configuration, as compared with the case of providing the detection coil separately from the excitation coil, the increase in the number of parts can be suppressed, and the device configuration can be simplified.

DESCRIPTION OF THE PREFERRED EMBODIMENTS

Hereinafter, embodiments in which the present invention is embodied will be described with reference to the attached drawings.

First Embodiment

Referring to FIG. 1 to FIG. 4, a configuration of a magnetic material inspection device 100 according to a first embodiment will be described.

Configuration of Magnetic Material Inspection Device

Figure 1:
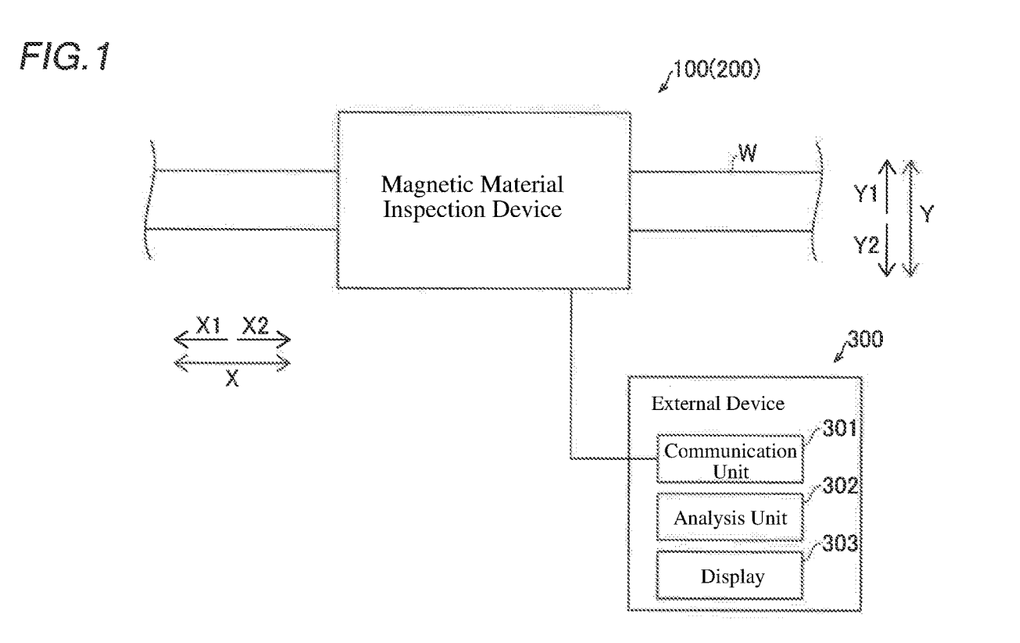
FIG. 1 is a schematic diagram showing a configuration of a magnetic material inspection device according to a first embodiment.

As shown in FIG. 1, the magnetic material inspection device 100 is configured to inspect a wire cable W, which is an object to be inspected. The wire cable W is used for cranes, elevators, suspension bridges, robots, etc. The magnetic material inspection device 100 is configured to periodically inspect a wire cable W. The magnetic material inspection device 100 is configured to inspect the damage of the wire cable W. The magnetic material inspection device 100 inspects a wire cable W while relatively moving along the surface of the wire cable W, which is an object to be inspected. In cases where the wire cable W moves, such as in a crane or an elevator, the inspection is performed in accordance with the movement of the wire cable W in a state in which the magnetic material inspection device 100 is fixed. Further, in cases where a wire cable W does not move as in a suspension bridge, the inspection is performed while moving the magnetic material inspection device 100 along the wire cable W. The wire cable W is arranged to extend in the X-direction at the position of the magnetic material inspection device 100. Note that the wire cable W is an example of the "magnetic material" recited in claims.

Figure 2:
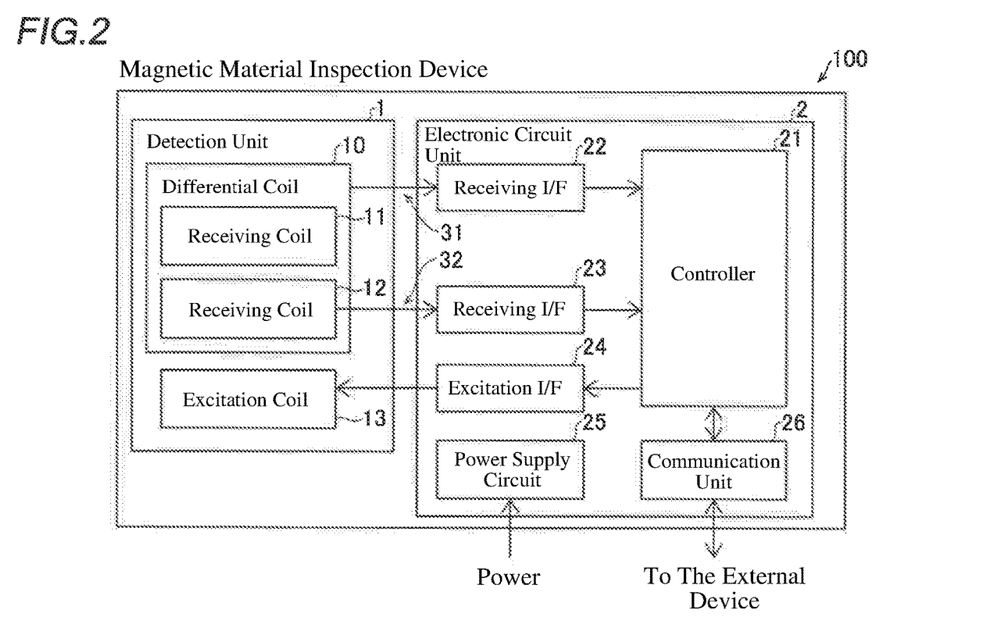
FIG. 2 is a block diagram showing a control configuration of the magnetic material inspection device according to the first embodiment.

As shown in FIG. 2, the magnetic material inspection device 100 is provided with a detection unit 1 and an electronic circuit unit 2. The detection unit 1 includes a differential coil 10 having a pair of receiving coils 11 and 12, and an excitation coil 13. The electronic circuit unit 2 includes a controller 21, a receiving I/F 22, a receiving I/F 23, an excitation I/F 24, a power supply circuit 25, and a communication unit 26. Further, the magnetic material inspection device 100 includes a first transmission line 31 and a second transmission line 32. Further, the magnetic material inspection device 100 is provided with a magnetic field application unit 4 (see FIG. 3). The receiving coil 12 is an example of the "detection coil" recited in claims.

The magnetic material inspection device 100 is connected by an external device 300 via the communication unit 26. The external device 300 is provided with a communication unit 301, an analysis unit 302, and a display 303. The external device 300 is configured to receive measurement data of the wire cable W by the magnetic material inspection device 100 via the communication unit 301. Further, the external device 300 is configured to analyze the type of damage, such as, e.g., wire breakage, cross-sectional area change, by the analysis unit 302, based on the received measurement data of the wire cable W. The external device 300 is configured to display the analysis result on the display 303. The external device 300 is configured to perform abnormality determination based on the analysis result and display the result on the display 303.

The wire cable W is formed by braiding (e.g., strand-braiding) magnetic wire materials. The wire cable W is a magnetic material composed of a long member extending in the X-direction. In the wire cable W, its state (e.g., presence or absence of scratches, etc.) is monitored to prevent the breakage of the wire cable W due to deterioration. The wire cable W progressed in the deterioration beyond a predetermined amount will be replaced.

Figure 3:
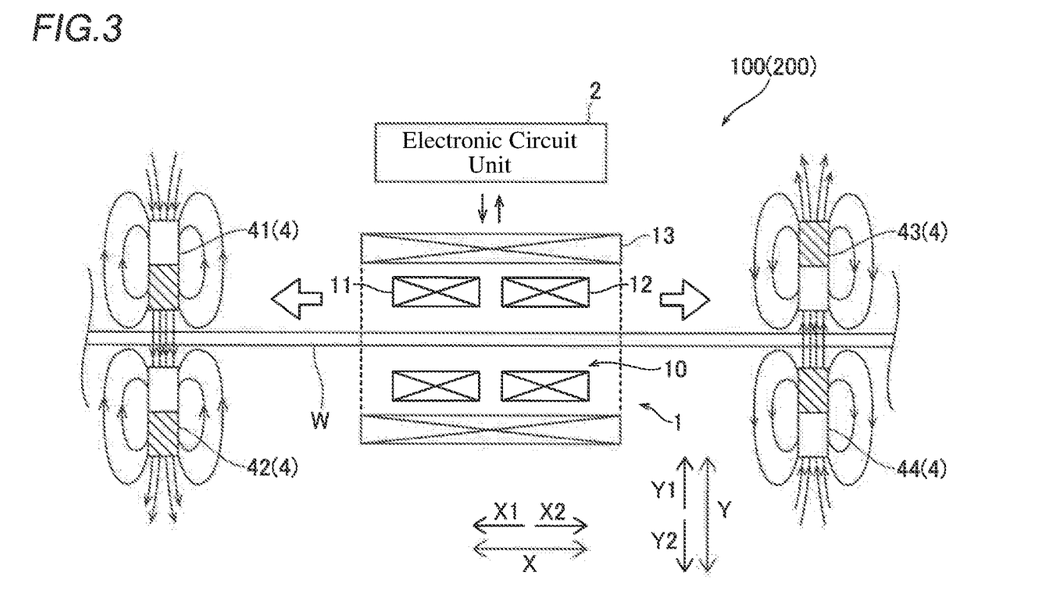
FIG. 3 is a diagram for explaining the configuration of the magnetic field application unit and the detection unit of the magnetic material inspection device according to the first embodiment.

As shown in FIG. 3, the magnetic material inspection device 100 is configured to detect the change in the magnetic field (magnetic flux) of the wire cable W. Note that it is configured such that no DC magnetizer is arranged in the vicinity of the coils of the magnetic material inspection device 100. Here, in the total magnetic flux sensor used for the wire inspection, a DC magnetizer is generally arranged near the detection coils. However, when the DC magnetizer is arranged at the sensor position, for example, the sensor detects the magnetic change a total of three times when the breakage portion approaches the DC magnetizer and when the breakage portion approaches the coil. Originally, it is desired that the sensor detects the magnetic change only when the breakage portion approaches. Therefore, in the case of using a DC magnetizer, there is a disadvantage that it is difficult to perform the quantitative measurement of the breakage portion.

The magnetic field application unit 4 is configured to align the magnitude and the direction of magnetization of the magnetic material by applying a magnetic field in advance in the Y-direction with respect to the wire cable W, which is an object to be inspected. Further, the magnetic field application unit 4 includes a first magnetic field application unit including magnets 41 and 42, and a second magnetic field application unit including magnets 43 and 44.

The first magnetic field application unit (magnets 41 and 42) are arranged on one side (on the X1-direction side) of the extending direction of the wire cable W with respect to the detection unit 1. The second magnetic field application unit (magnets 43 and 44) is arranged on the other side (on the X2-direction side) of the extending direction of the wire cable W with respect to the detection unit 1. The first magnetic field application unit (magnets 41 and 42) is configured to apply a magnetic field in the Y2-direction parallel to a plane intersecting with the extending direction (X-direction) of the wire cable W.

The second magnetic field application unit (magnets 43 and 44) is configured to apply a magnetic field in the Y1-direction parallel to a plane intersecting with the extending direction (X-direction) of the wire cable W. That is, the magnetic field application unit 4 is configured to apply a magnetic field in a direction substantially perpendicular to the X-direction, which is the longitudinal direction of the elongated material.

As shown in FIG. 3, the differential coil 10 (receiving coils 11 and 12) and the excitation coil 13 are wound a plurality of times along the longitudinal direction, respectively, with the extending direction of the wire cable W, which is an elongated magnetic material, as the central axis. The differential coil 10 and the excitation coil 13 each are a coil including a conductor portion formed so as to be cylindrical along the X direction (longitudinal direction) extending the wire cable W. Therefore, the surface formed by the conductive portion in which the differential coil 10 and the excitation coil 13 are wound is substantially perpendicular to the longitudinal direction.

The wire cable W passes through the inside of the differential coil 10 and the excitation coil 13. Further, the differential coil 10 is provided inside the excitation coil 13. However, the arrangement of the differential coil 10 and the excitation coil 13 is not limited thereto. The receiving coil 11 of the differential coil 10 is arranged on the X1-direction side. Further, the receiving coil 12 of the differential coil 10 is arranged on the X2-direction side. The receiving coils 11 and 12 are spaced apart from each other by several millimeters to several centimeters.

The excitation coil 13 excites the state of magnetization of the wire cable W. Specifically, the excitation coil 13 is configured such that the magnetic field generated based on an excitation AC current is applied along the X-direction in the interior of the excitation coil 13 by flowing the excitation AC current to the excitation coil 13.

The differential coil 10 is configured to transmit the differential signal of the pair of receiving coils 11 and 12. Specifically, the differential coil 10 is configured to detect the change in the magnetic field of the wire cable W and transmit the differential signal. The differential coil 10 is configured to detect the change in the magnetic field of the wire cable W in the X-direction, which is an object to be inspected and output a detection signal (voltage). That is, the differential coil 10 detects the change in the magnetic field in the X-direction intersecting with the Y-direction, with respect to the wire cable W to which the magnetic field is applied in the Y-direction by the magnetic field application unit 4. Further, the differential coil 10 is configured to output a differential signal (voltage) based on the change in the detected magnetic field of the wire cable W in the X-direction. Further, the differential coil 10 is arranged so that substantially all of the magnetic field generated by the excitation coil 13 can be detectable (can be input).

In cases where a defect (scratches or the like) exists in the wire cable W, the total magnetic flux (a value obtained by multiplying the magnetic field by the permeability and the area) of the wire cable W becomes small in a portion where the defect (scratches or the like) exists. As a result, for example, when the receiving coil 11 is positioned at a place where a defect (scratches, etc.) is present, the amount of magnetic flux passing through the receiving coil 12 changes as compared with the receiving coil 11, the absolute value (differential signal) of the difference in the detection voltage by the differential coil 10 increases. On the other hand, the differential signal at the portion where no defect (scratches, etc.) is present becomes substantially zero. Thus, in the differential coil 10, a clear signal (a signal with a good S/N ratio) representing the presence of a defect (scratches, etc.) is detected. With this, the electronic circuit unit 2 can detect the presence of a defect (scratches, etc.) of the wire cable W based on the value of the differential signal.

The controller 21 of the electronic circuit unit 2 is configured to control each portion of the magnetic material inspection device 100. Specifically, the controller 21 includes a processor, such as, e.g., a CPU, a memory, and an AD converter. The controller 21 is configured to receive the differential signal of the differential coil 10 and detect the state of the wire cable W. Further, the controller 21 is configured to perform control for exciting the excitation coil 13. Further, the controller 21 is configured to transmit the detection result of the state of the wire cable W to the external device 300 via the communication unit 26.

The receiving I/F 22 is configured to receive the differential signal from the differential coil 10 and transmit it to the controller 21. Specifically, the receiving I/F 22 includes an amplifier. Further, the receiving I/F 22 is configured to amplify the differential signal of the differential coil 10 and transmit it to the controller 21.

The receiving I/F 23 is configured to receive the detection signal from the receiving coil 12 and transmit it to the controller 21. Specifically, the receiving I/F 23 includes an amplifier. Further, the receiving I/F 23 is configured to amplify the detection signal of the receiving coil 12 and transmit it to the controller 21.

The excitation I/F 24 is configured to receive a signal from the controller 21 and control the power supply to the excitation coil 13. Specifically, the excitation I/F 24 controls the power supply from the power supply circuit 25 to the excitation coil 13 based on the control signal from the controller 21.

Here, in the first embodiment, the controller 21 is configured to detect the state of the wire cable W based on the differential signal of the differential coil 10 and detect the state of the wire cable W based on the detection signal of the receiving coil 12. Specifically, the controller 21 is configured to detect the abrupt structural change of the wire cable W based on the differential signal of the differential coil 10 and detect the gradual structural change of the wire cable W based on the detection signal of the receiving coil 12.

Further, in the first embodiment, the detection coil for detecting the gradual structural change of the wire cable W is configured by the receiving coil 12 of the pair of receiving coils 11 and 12 of the differential coil 10. In other words, the receiving coil 12 also acts as a detection coil for detecting a change in the magnetic field of the wire cable W and transmitting the detection signal.

Further, the controller 21 is configured to comprehensively determine the damage of the wire cable W based on both the differential signal of the differential coil 10 and the detection signal of the receiving coil 12.

Further, the controller 21 is configured to determine whether or not the wire cable W is defective. In addition, the controller 21 has a function of determining the size of a defect (scratches or the like) of the wire cable W. The controller 21 is configured to detect the speed of the relative movement of the wire cable W with respect to the detection unit 1. That is, the controller 21 stores the position information of the wire cable W and the detection result in association with each other. Note that, when acquiring the inspection position of the wire cable W, a position detection may be performed using a GPS or the like. That is, it may be configured to provide a GPS receiver to the magnetic material inspection device 100 to detect the state of the wire cable W while acquiring the position information by the GPS receiver while moving the magnetic material inspection device 100.

Here, a method for determining a defect of a wire cable W by the controller 21 will be described. In cases where there is a local breakage or rust in the wire cable W, the magnetic flux passing through the receiving coils 11 and 12 of the differential coil 10 changes. The differential signal output from the differential coil 10 is a signal of the difference between the receiving coils 11 and 12, so the difference appears as a signal. The controller 21 detects this signal to detect an abrupt permeability change of the wire cable W. The controller 21 detects the abrupt structural change of the wire cable W based on the abrupt permeability change of the wire cable W.

In cases where the wire cable W gradually changes due to rust, abrasion, elongation, etc., the magnetic flux passing through the receiving coil 12 gradually changes. In the detection signal by the receiving coil 12, the absolute value of the magnetic flux passing through the wire cable W is reflected. The detection signal will include noise. The controller 21 takes the average of the detection signals by the receiving coil 12 (takes the moving average, the average in the case of measuring a plurality of times) to reduce the noise. Further, the controller 21 judges the detection signal by the receiving coil 12 based on a predetermined range to detect the gradual structural change of the wire cable W. That is, the controller 21 determines that the wire cable W is normal when the detection signal is within a predetermined range and detects that the magnetic flux of the wire cable W is gradually decreased when the detection signal is smaller than the predetermined range. That is, it is detected that the wire cable W gradually becomes thinner (thicker) or gradually becomes larger (smaller) in rust.

Figure 4:
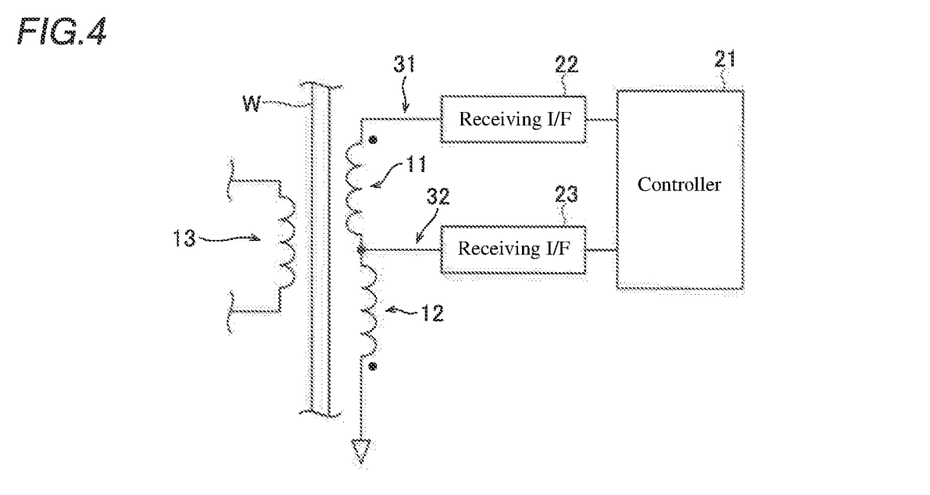
FIG. 4 is a diagram for explaining the circuit configuration of the magnetic material inspection device according to the first embodiment.

As shown in FIG. 4, the first transmission line 31 is configured to transmit the differential signal of the differential coil 10. Specifically, the first transmission line 31 is configured to transmit a signal based on the potential combined with the receiving coils 11 and 12 connected inversely in series to the controller 21 via the receiving I/F 22. Further, the second transmission line 32 is configured to transmit the detection signal of the receiving coil 12. Specifically, the second transmission line 32 is configured to transmit a signal based on the potential between the receiving coils 11 and 12 connected inversely in series to the controller 21 via the receiving I/F 23.

Effects of First Embodiment

In this first embodiment, the following effects can be obtained.

In the first embodiment, as described above, it is possible to reduce the noise due to the influence of the magnetic field around the wire cable W by the differential signal of the differential coil 10. Therefore, it is possible to easily detect an abrupt structural change of the wire cable W in the range of about the distance between the pair of receiving coils 11 and 12 of the differential coil 10. Further, it is possible to detect the absolute value of the magnetic flux passing through the wire cable W by the detection signal of the receiving coil 12. Therefore, although the noise remains somewhat, it is possible to easily detect a gradual structural change of the wire cable W in a very large range as compared with the distance between the pair of receiving coils 11 and 12 of the differential coil 10. As a result, both the abrupt structural change of the wire cable W and the gradual structural change of the wire cable W can be easily detected.

Further, in the first embodiment, as described above, the controller 21 is configured to detect an abrupt structural change of the wire cable W based on the differential signal of the differential coil 10 and detect a gradual structural change of the wire cable W based on the detection signal of the receiving coil 12. With this, based on the differential signal and the detection signal, it is possible to easily detect, for example, an abrupt structural change of the wire cable W, such as, e.g., breakage, and, for example, a gradual structural change of the magnetic material, such as, e.g., a gradual cross-sectional area change.

Further, in the first embodiment, as described above, the controller 21 is configured to comprehensively determine the damage of the wire cable W based on both the differential signal of the differential coil 10 and the detection signal of the receiving coil 12. With this configuration, the local damage to the wire cable W, such as, e.g., breakage, a cross-sectional area change, rust, and abrasion of a wire cable W, can be detected based on the differential signal. Further, the wide range damage to the wire cable W, such as, e.g., breakage, a cross-sectional area change, rust, and abrasion of the wire cable W, can also be detected based on the detection signal.

Further, in the first embodiment, as described above, the first transmission line 31 for transmitting the differential signal of the differential coil 10 and the second transmission line 32 for transmitting the detection signal of the receiving coil 12 are provided. With this configuration, the differential signal and the detection signal are transmitted via the first transmission line 31 and the second transmission line 32, respectively. Therefore, it is possible to detect both the abrupt structural change and the gradual structural change of the wire cable W in parallel. As a result, it is possible to shorten the time required to inspect the wire cable W.

Further, in the first embodiment, as described above, the detection coil for detecting the gradual structural change of the wire cable W is configured by one of the receiving coils 12 of the differential coil 10. With this configuration, as compared with the case of providing the detection coil separately from the differential coil 10, it is possible to suppress the increase in the number of parts and simplify the apparatus configuration.

Second Embodiment

Figure 5:
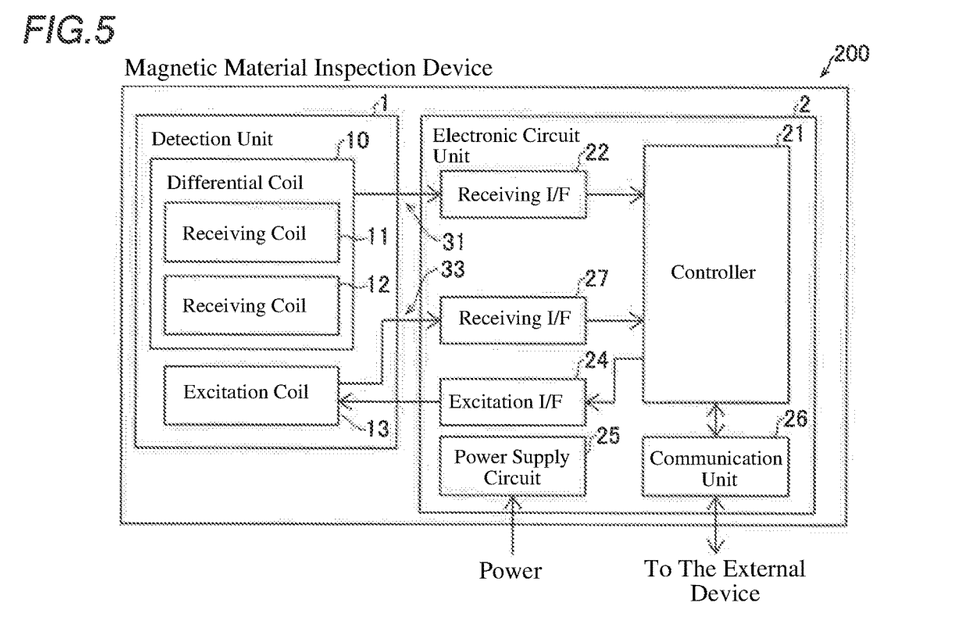
FIG. 5 is a block diagram showing a control configuration of the magnetic material inspection device according to a second embodiment.

Next, referring to FIG. 5 and FIG. 6, the configuration of the magnetic material inspection device 200 according to a second embodiment will be described. An example will be described in which, unlike the first embodiment in which the detection coil for detecting the gradual structural change of the wire cable W is configured by one receiving coil of the differential coil, in the magnetic material inspection device 200 of the second embodiment, the detection coil is configured by the excitation coil. Note that the same configuration as that of the above-described first embodiment is denoted by the same reference numeral in the figures, and the description thereof will be omitted. Note that the wire cable W is an example of the "magnetic material" recited in claims.

Configuration of Magnetic Material Inspection Device

The magnetic material inspection device 200 is configured to inspect the wire cable W, which is an object to be inspected. Further, as shown in FIG. 5, the magnetic material inspection device 200 is provided with a detection unit 1 and an electronic circuit unit 2. The detection unit 1 includes a differential coil 10 having a pair of receiving coils 11 and 12, and an excitation coil 13. The electronic circuit unit 2 includes a controller 21, a receiving I/F 22, an excitation I/F 24, a power supply circuit 25, a communication unit 26, and a receiving I/F 27. The magnetic material inspection device 200 is provided with a first transmission line 31 and a second transmission line 33. Further, the magnetic material inspection device 200 is provided with a magnetic field application unit 4 (see FIG. 3). Note that the excitation coil 13 is an example of the "detection coil" recited in claims.

The excitation coil 13 excites the state of magnetization of the wire cable W. Specifically, the excitation coil 13 is configured to flow an excitation AC current to apply the magnetic field generated based on the excitation AC current along the X direction in the interior of the excitation coil 13.

Here, in the second embodiment, the detection coil for detecting a gradual structural change of the wire cable W is constituted by the excitation coil 13 for exciting the state of the magnetization of the wire cable W. That is, the excitation coil 13 also acts as a detection coil for detecting a change in the magnetic field of the wire cable W to transmit the detection signal. Specifically, based on the potential applied from the excitation I/F 24 and the potential output to the receiving I/F 27, a change in the impedance in the excitation coil 13 is detected. With this configuration, the structural change of the wire cable W is detected.

Further, in the second embodiment, the controller 21 is configured to detect the state of the wire cable W based on the differential signal of the differential coil 10 and detect the state of the wire cable W based on the detection signal of the excitation coil 13. Specifically, the controller 21 detects an abrupt structural change of the wire cable W based on the differential signal of the differential coil 10 and detect a gradual structural change of the wire cable W based on the detection signal of the excitation coil 13. Further, the controller 21 is configured to comprehensively determine the damage of the wire cable W based on both the differential signal of the differential coil 10 and the detection signal of the excitation coil 13.

The receiving I/F 27 is configured to receive the detection signal from the excitation coil 13 and transmit it to the controller 21. Specifically, the receiving I/F 27 includes an amplifier. Further, the receiving I/F 27 is configured to amplify the detection signal of the excitation coil 13 and transmit it to the controller 21.

Figure 6:
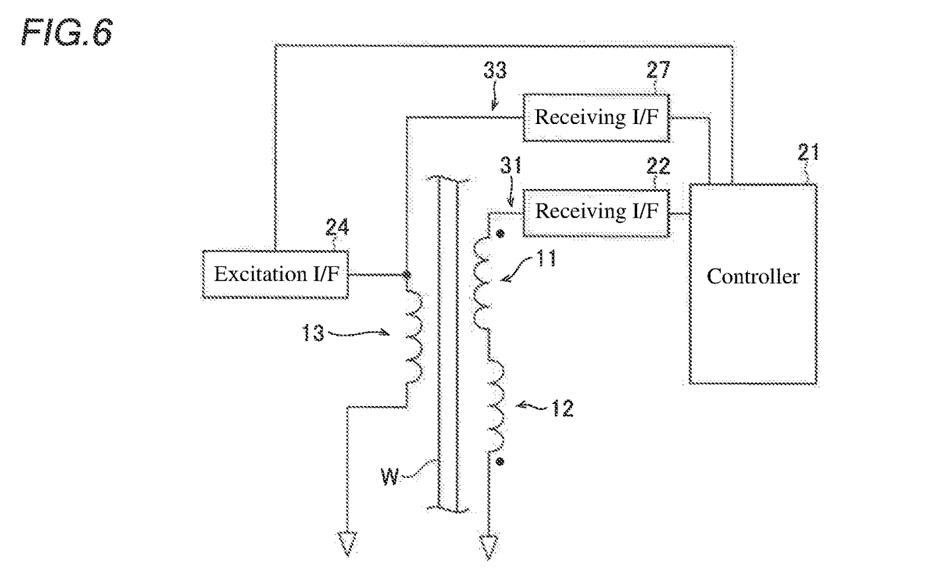
FIG. 6 is a diagram for explaining the circuit configuration of the magnetic material inspection device according to the second embodiment.

As shown in FIG. 6, the first transmission line 31 is configured to transmit the differential signal of the differential coil 10. Specifically, the first transmission line 31 is configured to transmit the signal based on the potential combined with the receiving coils 11 and 12 connected inversely in series to the controller 21 via the receiving I/F 22. Further, the second transmission line 33 is configured to transmit the detection signal of the excitation coil 13. Specifically, the second transmission line 33 is configured to transmit the signal based on the potential between the excitation I/F 24 and the excitation coil 13 to the controller 21 via the receiving I/F 27.

The rest of the configuration of the second embodiment is the same as that of the first embodiment.

Effects of Second Embodiment

In this second embodiment, the following effects can be obtained.

In the second embodiment, as described above, both the abrupt structural change of the wire cable W and the gradual structural change of the wire cable W can be easily detected.

Further, in the second embodiment, as described above, the detection coil for detecting the gradual structural change of the wire cable W is configured by the excitation coil 13 for exciting the state of the magnetization of the wire cable W. With this configuration, as compared with the case of providing the detection coil separately from the excitation coil 13, it is possible to suppress the increase in the number of parts and simplify the apparatus configuration.

The other effects of the second embodiment are the same as those of the above-described first embodiment.

Modifications

It should be understood that the embodiments disclosed here are examples in all respects and are not restrictive. The scope of the present invention is shown in claims rather than by the aforementioned embodiments, and the scope of the present invention includes all modifications (modified examples) within the meanings and ranges equivalent to the claims.

For example, in the above-described first and second embodiment, an example is shown in which the magnetic material to be inspected by the magnetic material inspection device is a wire cable, but the present invention is not limited thereto. In the present invention, the magnetic material to be inspected by the magnetic material inspection device may be a magnetic material other than wire cables.

In the first and second embodiment, an example is shown in which the wire cables to be inspected are used for cranes, elevators, suspension bridges, robots, and the like, but the present invention is not limited thereto. In the present invention, the wire cables (magnetic material) to be inspected may be used for applications other than cranes, elevators, suspension bridges, and robots.

In the first and second embodiments of the present embodiment, an example is shown in which the magnetic material inspection device includes the magnetic field application unit, but the present invention is not limited thereto. In the present invention, the magnetic material inspection device may not include a magnetic field application unit.

In the first and second embodiments of the present embodiment, an example is shown in which the magnetic material inspecting apparatus is connected to an external device, but the present invention is not limited thereto. In the present invention, the magnetic material inspection device may be used independently without being connected to an external device.

Further, in the first embodiment and the second embodiment, an example is shown in which the detection coil is configured by one of the receiving coils of the differential coil, the invention is not limited thereto. In the present invention, a detection coil may be provided separately from the receiving coil and the excitation coil.

Figure 7:
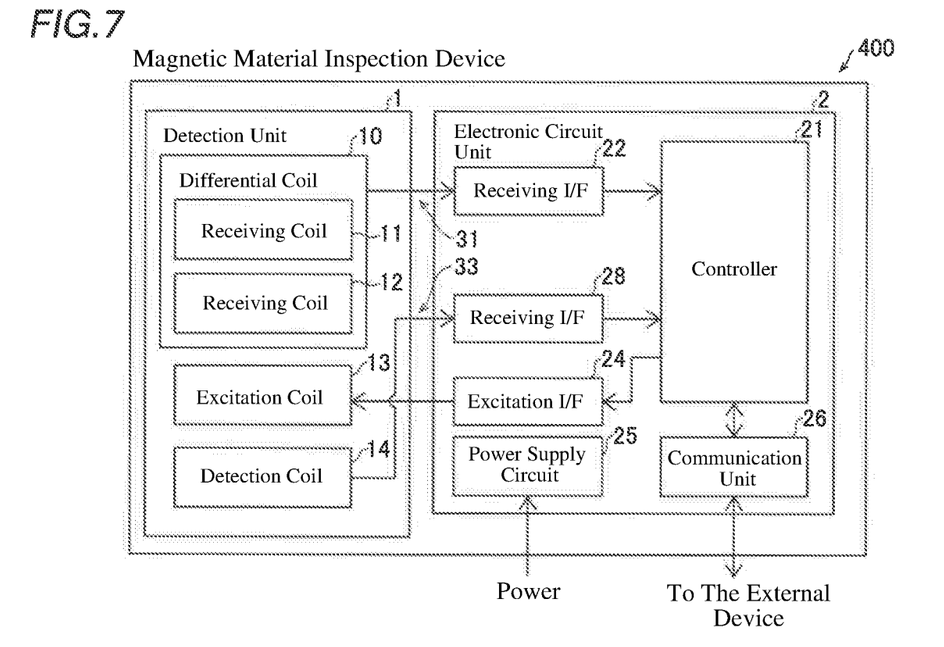
FIG. 7 is a block diagram showing a control configuration of a magnetic material inspection device according to a first modification of the first embodiment and the second embodiment.

For example, as in the first modification shown in FIG. 7, the magnetic material inspection device 400 is configured to inspect a wire cable W, which is an object to be inspected. Further, the magnetic material inspection device 400 is provided with a detection unit 1 and an electronic circuit unit 2. The detection unit 1 includes a differential coil 10 having a pair of receiving coils 11 and 12, an excitation coil 13, and a detection coil 14. The electronic circuit unit 2 includes a controller 21, a receiving I/F 22, an excitation I/F 24, a power supply circuit 25, a communication unit 26, and a receiving I/F 28. Further, the magnetic material inspection device 400 is provided with a first transmission line 31 and a second transmission line 33. Further, the magnetic material inspection device 400 is provided with a magnetic field application unit 4 (see FIG. 3). The arrangement of the detection coil 14 is not particularly limited. For example, the detection coil 14 may be arranged to wrap the differential coil 10. Further, the detection coil 14 may be arranged away from the differential coil 10. By providing the detection coil 14 separately from the differential coil 10 and the excitation coil 13, it is possible to improve the degree of freedom in the device design.

In the first and second embodiments described above, an example is shown in which the excitation coil is provided in the magnetic material inspection device, but the present invention is not limited thereto. In the present invention, it is not necessary to provide an excitation coil in the magnetic material inspection device.

Figure 8:
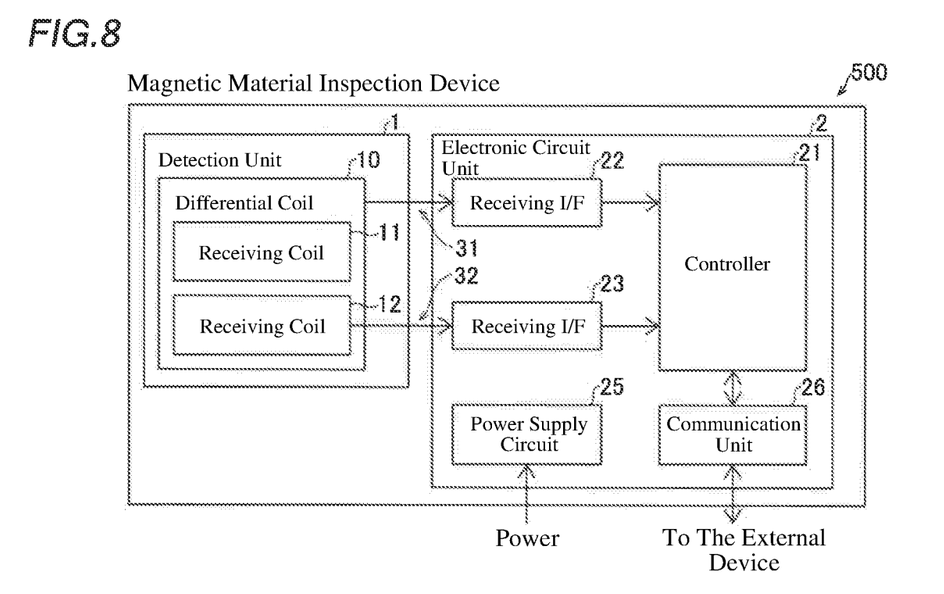
FIG. 8 is a block diagram showing a control configuration of a magnetic material inspection device according to a second modification of the first embodiment and the second embodiment.

For example, as in a second modification shown in FIG. 8, the magnetic material inspection device 500 is configured to inspect the wire cable W, which is an object to be inspected. Further, the magnetic material inspection device 500 is provided with a detection unit 1 and an electronic circuit unit 2. The detection unit 1 includes a differential coil 10 having a pair of receiving coils 11 and 12. The electronic circuit unit 2 includes a controller 21, a receiving I/F 22, a receiving I/F 23, a power supply circuit 25, and a communication unit 26. Further, the magnetic material inspection device 500 is provided with a first transmission line 31 and a second transmission line 33. Further, the magnetic material inspection device 500 is provided with a magnetic field application unit 4 (see FIG. 3). As characteristics in cases where there is no excitation means, the detection system is generally implemented. Further, when the relative speed of the wire cable W to the magnetic material inspection device 500 is 0, the detection cannot be performed. Also, the magnitude of the output may vary depending on the relative speed. That is, when the exciting means is not used, the signal detection is performed by relatively moving the wire cable W at a velocity of a certain degree or more.

The invention claimed is:

1. A magnetic material inspection device, comprising:
 a differential coil configured to detect a change in a magnetic field of a magnetic material and transmit a differential signal, the differential coil including a pair of receiving coils;
 a detection coil configured to detect the change in the magnetic field of the magnetic material and transmit a detection signal; and
 a controller configured to detect a state of the magnetic material based on the differential signal of the differential coil and detect the state of the magnetic material based on the detection signal of the detection coil,
 wherein the detection coil is configured to detect the signal of a single coil as the detection signal.

2. The magnetic material inspection device as recited in claim 1,
 wherein the controller is configured to detect an abrupt structural change of the magnetic material based on the differential signal of the differential coil and detect a gradual structural change of the magnetic material based on the detection signal of the detection coil.

3. The magnetic material inspection device as recited in claim 1,
 wherein the controller is configured to comprehensively determine damage of the magnetic material based on both the differential signal of the differential coil and the detection signal of the detection coil.

4. A magnetic material inspection device, comprising:
 a differential coil configured to detect a change in a magnetic field of a magnetic material and transmit a differential signal, the differential coil including a pair of receiving coils;
 a detection coil configured to detect the change in the magnetic field of the magnetic material and transmit a detection signal;
 a controller configured to detect a state of the magnetic material based on the differential signal of the differential coil and detect the state of the magnetic material based on the detection signal of the detection coil;
 a first transmission line for transmitting the differential signal of the differential coil; and
 a second transmission line for transmitting the detection signal of the detection coil.

5. The magnetic material inspection device as recited in claim 1,
 wherein the detection coil is configured by one of the pair of the receiving coils of the differential coil.

6. The magnetic material inspection device as recited in claim 1,
 wherein the detection coil is configured by an excitation coil for exciting a state of magnetization of the magnetic material.

7. A magnetic material inspection device, comprising:
 a differential coil configured to detect a change in a magnetic field of a magnetic material and transmit a differential signal, the differential coil including a pair of receiving coils;
 a detection coil configured to detect the change in the magnetic field of the magnetic material and transmit a detection signal, the detection coil being configured by one of the pair of receiving coils; and
 a controller configured to detect a state of the magnetic material based on the differential signal of the differential coil and detect the state of the magnetic material based on the detection signal of the detection coil, wherein the differential signal is based on a difference between the pair of receiving coils, and wherein the detection signal is based on a magnetic flux passing through the one of the pair of receiving coils.

8. The magnetic material inspection device as recited in claim 7, wherein the controller is configured to detect an abrupt structural change of the magnetic material based on the differential signal of the differential coil and detect a gradual structural change of the magnetic material based on the detection signal of the detection coil.

9. The magnetic material inspection device as recited in claim 7, wherein the controller is configured to comprehensively determine damage of the magnetic material based on both the differential signal of the differential coil and the detection signal of the detection coil.

10. The magnetic material inspection device as recited in claim 7, further comprising:

a first transmission line for transmitting the differential signal of the differential coil; and a second transmission line for transmitting the detection signal of the detection coil.

* * * * *